(12) United States Patent
Joshi et al.

(10) Patent No.: US 10,848,140 B1
(45) Date of Patent: Nov. 24, 2020

(54) METHOD AND SYSTEM FOR DETECTING CLOCK FAILURE

(71) Applicant: NXP USA, Inc., Austin, TX (US)

(72) Inventors: Dinesh Joshi, Delhi (IN); Nidhi Sinha, Noida (IN); Akshay Kumar Pathak, Noida (IN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/933,178

(22) Filed: Jul. 20, 2020

(51) Int. Cl.
| | |
|---|---|
| H03K 5/19 | (2006.01) |
| H03K 5/1534 | (2006.01) |
| H03K 5/00 | (2006.01) |
| G06F 1/04 | (2006.01) |
| H03K 5/26 | (2006.01) |

(52) U.S. Cl.
CPC ............ *H03K 5/19* (2013.01); *H03K 5/1534* (2013.01); *G06F 1/04* (2013.01); *H03K 5/26* (2013.01); *H03K 2005/00013* (2013.01)

(58) Field of Classification Search
CPC ................................ H03K 5/19; H03K 5/1534
See application file for complete search history.

(56) References Cited

U.S. PATENT DOCUMENTS

| | | | |
|---|---|---|---|
| 4,446,437 A | 5/1984 | Rinaldi | |
| 6,078,193 A * | 6/2000 | Bazuin | G06F 1/04 |
| | | | 326/93 |
| 6,343,334 B1 * | 1/2002 | Uemura | G06F 1/24 |
| | | | 710/10 |
| 6,668,334 B1 | 12/2003 | Abel et al. | |
| 6,686,802 B2 * | 2/2004 | Maeda | G06F 1/04 |
| | | | 331/1 A |
| 6,815,991 B2 * | 11/2004 | Yee | H03K 5/00006 |
| | | | 327/116 |
| 7,071,752 B2 * | 7/2006 | Kowkutla | H03F 3/2171 |
| | | | 327/291 |
| 7,679,404 B2 * | 3/2010 | Neidengard | H04L 7/0008 |
| | | | 327/18 |
| 8,350,596 B1 * | 1/2013 | Soh | H03K 19/00346 |
| | | | 327/20 |
| 8,446,193 B2 | 5/2013 | Zhang et al. | |
| 8,890,575 B1 * | 11/2014 | Jang | H03K 5/1534 |
| | | | 327/31 |
| 8,938,365 B2 | 1/2015 | Ely | |
| 9,234,936 B1 | 1/2016 | Thakur et al. | |
| 9,858,134 B2 * | 1/2018 | Warriner | G01R 31/00 |
| 10,014,849 B2 | 7/2018 | Noh | |
| 2007/0075753 A1 * | 4/2007 | Parker | G01R 29/02 |
| | | | 327/116 |

(Continued)

*Primary Examiner* — Thomas J. Hiltunen
(74) *Attorney, Agent, or Firm* — Rajeev Madnawat

(57) ABSTRACT

System and method for detecting clock failure are disclosed. The system includes a pulse train generator, a delay circuit, and a failure detection circuit. The pulse train generator receives an input clock and generates a pulse train including a plurality of pulses aligned with a set of rising edges and a set of falling edges of the input clock. The delay circuit delays the input clock by a first time-interval to generate a first delayed clock. The failure detection circuit receives the pulse train and the first delayed clock from the pulse train generator and the delay circuit, respectively, and generates a clock detection signal that transitions from a first logic state to a second logic state based on a failure in the input clock.

20 Claims, 7 Drawing Sheets

(56) References Cited

U.S. PATENT DOCUMENTS

2008/0054945 A1* 3/2008 El-Kik .................... H03K 5/19
                                                    326/93
2008/0272808 A1* 11/2008 Sundby ................ H03L 7/0891
                                                    327/20

* cited by examiner

METHOD AND SYSTEM FOR DETECTING CLOCK FAILURE

BACKGROUND

The present disclosure relates generally to electronic circuits, and, more particularly, to a method and a system for detecting clock failure.

Clock signal is an important requirement for accurate operation of electronic devices such as encoders, amplifiers, security cameras, digital locks, fire alarms, and the like. Failure in the clock signal may lead to malfunction or failure of the digital devices. Hence, clock failure detection is of utmost importance in safety compliant electronic devices such as security camera, digital locks, fire alarms, automotive systems, and the like.

A known solution to detect clock failure involves the use of a reference clock signal. In one example, rising and falling edges of the clock signal are compared with rising and falling edges of the reference clock signal to detect clock failure. In another example, a number of clock cycles in the reference clock signal is compared with a number of clock cycles in the clock signal to detect the clock failure. Typically, clock failure detection using the reference clock signal operates on an assumption that the reference clock signal is always available and operates correctly at all times. The use of reference clock signal requires an additional reference clock generator and bulky counters, resulting in an increase in weight, cost, and size of an electronic device, which is undesirable. Further, various known solutions that do not rely on reference clock signal to detect clock failure exhibit some additional problems, such as physical design limitations, timing and scalability concerns, and delay balancing limitations.

Another known solution to detect clock failure involves the use of analog circuits such as one or more capacitive components. The capacitive components maintain different charging and discharging profiles based on presence or absence of the clock signal. Typically, such analog circuits are required to be tuned according to various process, temperature, or voltage variations during device manufacturing and/or device operation. Further, the analog circuits are bulky and expensive.

In light of the foregoing, it would be advantageous to have a clock failure detection system that solves the abovementioned problems and mitigates the need of a reference clock signal and analog circuits for detecting clock failure.

SUMMARY

In one embodiment, a system for detecting clock failure is disclosed. The system includes a pulse train generator that is configured to receive an input clock and generate a pulse train. The pulse train includes a plurality of pulses aligned with a set of rising edges and a set of falling edges of the input clock. The system further includes a delay circuit that is configured to delay the input clock by a first time-interval to generate a first delayed clock. The system further includes a failure detection circuit that is coupled to the pulse train generator and the delay circuit. The failure detection circuit is configured to receive the pulse train and the first delayed clock, and generate a clock detection signal. The clock detection signal transitions from a first logic state to a second logic state based on a failure in the input clock.

In another embodiment, a system-on-chip (SoC) is disclosed. The SoC includes a clock source that is configured to generate an input clock. The SoC further includes a clock failure detection system that is coupled to the clock source, and configured to detect clock failure. Further, the clock failure detection system includes a pulse train generator that is configured to receive the input clock and generate a pulse train. The pulse train includes a plurality of pulses aligned with a set of rising edges and a set of falling edges of the input clock. The clock failure detection system further includes a delay circuit that is configured to delay the input clock by a first time-interval to generate a first delayed clock. The clock failure detection system further includes a failure detection circuit that is coupled to the pulse train generator and the delay circuit. The failure detection circuit is configured to receive the pulse train and the first delayed clock, and generate a clock detection signal. The clock detection signal transitions from a first logic state to a second logic state based on a failure in the input clock.

In another embodiment, a method for detecting clock failure is disclosed. The method includes generation of a pulse train by a pulse train generator of a clock failure detection system. The pulse train includes a plurality of pulses aligned with a set of rising edges and a set of falling edges of an input clock. The method further includes delaying, by a delay circuit of the clock failure detection system, the input clock by a first time-interval to generate a first delayed clock. The method further includes receiving the pulse train and the first delayed clock by a failure detection circuit of the clock failure detection system. The method further includes generating a clock detection signal by the failure detection circuit. The clock detection signal is generated based on the pulse train and the first delayed clock such that the clock detection signal transitions from a first logic state to a second logic state based on a failure in the input clock.

In some embodiments, the pulse train generator includes a first delay element, first and second logic gates coupled to the first delay element, and a third logic gate that is coupled to the first and second logic gates. The first delay element is configured to delay the input clock by a second time-interval to generate a second delayed clock. The first logic gate is configured to receive the second delayed clock and the input clock, and generate a first intermediate signal. The first intermediate signal includes a first set of pulses aligned with the set of rising edges of the input clock. The second logic gate is configured to receive the second delayed clock and the input clock, and generate a second intermediate signal. The second intermediate clock includes a second set of pulses aligned with the set of falling edges of the input clock. The third logic gate is configured to receive the first and second intermediate signals and generate the pulse train. Each of the plurality of pulses of the pulse train have a first pulse width corresponding to the second time-interval.

In some embodiments, the first time-interval is greater than a clock period of the input clock and the second time-interval is less than half of the clock period.

In some embodiments, the delay circuit includes a second plurality of delay elements that are coupled in a series arrangement. The second plurality of delay elements are configured to receive the input clock, delay the input clock by the first time-interval, and generate the first delayed clock.

In some embodiments, the failure detection circuit includes first and second reset synchronizer circuits coupled to the pulse train generator and the delay circuit, a fourth logic gate coupled to the first and second synchronizer circuits, and a fifth logic gate coupled to the fourth logic gate. The first reset synchronizer circuit is configured to receive the pulse train and the first delayed clock, and generate a first detection signal. The first detection signal transitions from the first logic state to the second logic state based on the failure during a first phase of the input clock. The second reset synchronizer circuit is configured to receive the pulse train and the first delayed clock, and generate a second detection signal. The second detection signal transitions from the first logic state to the second logic state based on the failure during a second phase of the input clock. The fourth logic gate is configured to receive the first and second detection signals, and generate a third detection signal. The fifth logic gate is configured to receive the third detection signal and an enable input, and generate the clock detection signal. In one embodiment, the first phase is a low phase of the input clock and the second phase is a high phase of the input clock.

In some embodiments, the first reset synchronizer includes a first flip-flop and a second flip-flop. The first flip-flop includes a first reset terminal that is coupled to the pulse train generator, and configured to receive the pulse train. The first flip-flop further includes a first clock terminal that is coupled to the delay circuit, and configured to receive the first delayed clock. The first flip-flop further includes a first output terminal that is configured to generate a first flip-flop output. The second flip-flop includes a first input terminal that is coupled to the first output terminal, and configured to receive the first flip-flop output. The second flip-flop further includes a second reset terminal that is coupled to the pulse train generator, and configured to receive the pulse train. The second flip-flop further includes a second clock terminal that is configured to receive an inverted version of the first delayed clock and a second output terminal that is configured to generate the first detection signal.

In some embodiments, the second reset synchronizer circuit includes a third flip-flop and a fourth flip-flop. The third flip-flop includes a third reset terminal that is coupled to the pulse train generator, and configured to receive the pulse train. The third flip-flop further includes a third clock terminal that is configured to receive an inverted version of the first delayed clock, and a third output terminal that is configured to generate a second flip-flop output. The fourth flip-flop includes a second input terminal that is coupled to the third output terminal, and configured to receive the second flip-flop output. The fourth flip-flop further includes a fourth reset terminal that is coupled to the pulse train generator and configured to receive the pulse train, and a fourth clock terminal that is coupled to the delay circuit and configured to receive the first delayed clock. The fourth flip-flop further includes a fourth output terminal that is configured to generate the second detection signal.

Thus, the method and system of the present disclosure ensure an uninterrupted monitoring of the input clock for detecting clock failure. The system does not require any reference clock and/or bulky analog circuitry, thus, resulting in a significant reduction in the weight and cost of the electronic devices. Since the system uses different circuitry for detecting clock failure during different phases of the input clock, the phase associated with the clock failure may also be detected. Further, the disclosed system eliminates metastability issues, and hence is immune to noise and variations in other device parameters (e.g., temperature, humidity, and the like).

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
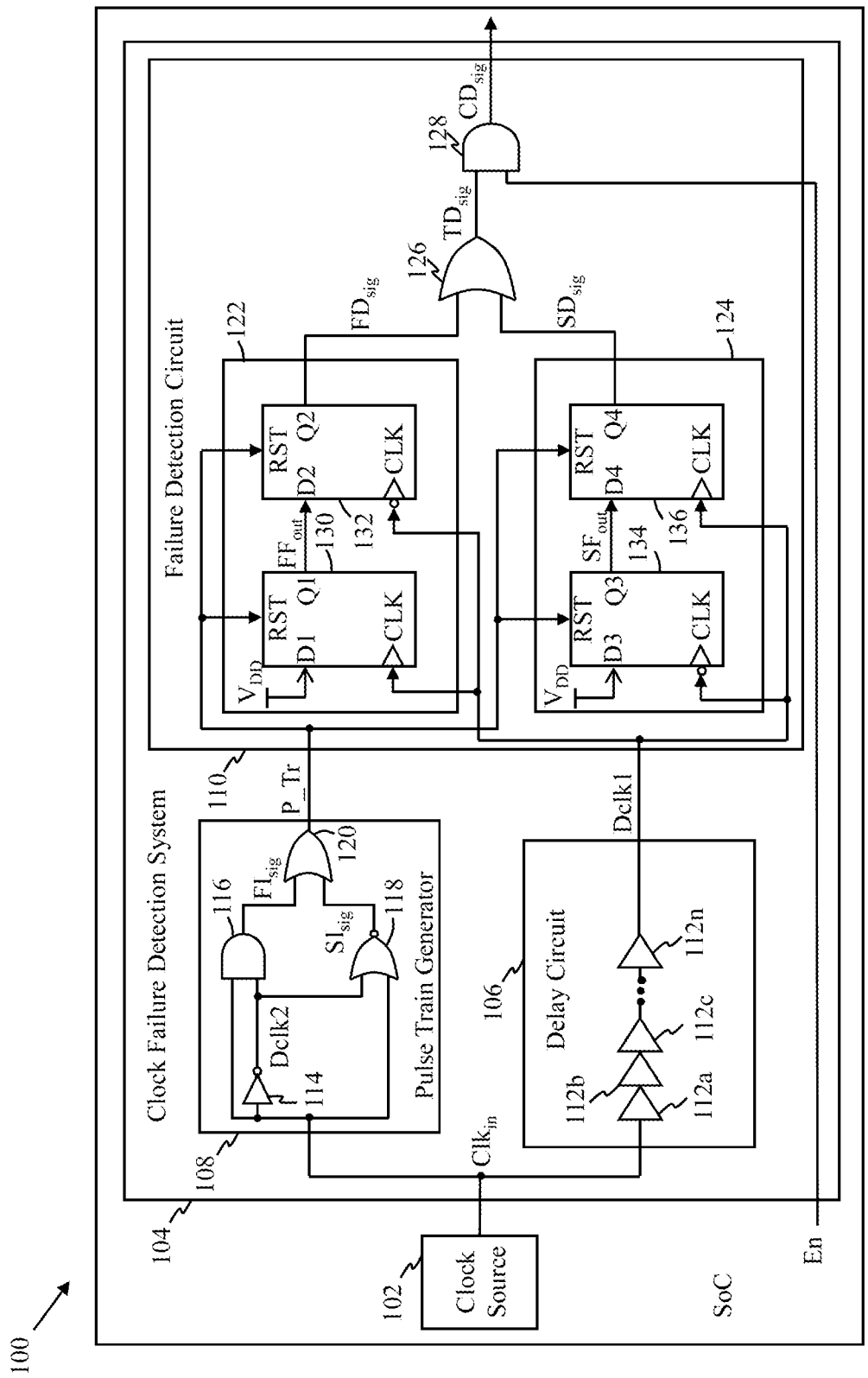
FIG. 1 illustrates a schematic block diagram of a system-on-chip (SoC) in accordance with an embodiment of the present disclosure.

FIG. 1 illustrates a schematic block diagram of a system-on-chip (SoC) 100 in accordance with an embodiment of the present disclosure. The SoC 100 includes a clock source 102 that is configured to generate an input clock $Clk_{in}$, and a clock failure detection system 104 that is coupled to the clock source 102 and configured to detect failure in the input clock $Clk_{in}$. It will be understood by those of ordinary skill in the art that the SoC 100 includes various other circuits and systems for its operation, which are not shown in order not to obscure the disclosure. The SoC 100 may be included in various devices such as automotive devices, mobile devices, network devices, industrial robotic devices, or the like. The clock failure detection system 104 includes a delay circuit 106, a pulse train generator 108, and a failure detection circuit 110.

The delay circuit 106 is an electronic circuit that is coupled to the clock source 102, and configured to receive the input clock $Clk_{in}$ from the clock source 102. The delay circuit 106 is further configured to delay the input clock $Clk_{in}$ by a first time-interval $t_1$ and generate a first delayed clock Dclk1. The delay circuit 106 includes first through nm delay elements 112a-112n coupled in a series arrangement. Hereinafter, the first through $n^{th}$ delay elements 112a-112n are collectively referred to as "a plurality of delay elements 112a-112n". The plurality of delay elements 112a-112n are configured to receive the input clock $Clk_{in}$, delay the input clock $Clk_{in}$ by the first time-interval $t_1$, and generate the first delayed clock Dclk1. The first time-interval $t_1$ refers to a collective delay introduced in the input clock $Clk_{in}$ by the plurality of delay elements 112a-112n. In order to fulfill a minimum delay requirement across process, voltage or temperature (PVT) compensation, the first time-interval $t_1$ is set to be greater than a clock period of the input clock $Clk_{in}$. In one embodiment, the plurality of delay elements 112a-112n include an even number of NOT (inverter) gates. Other examples of the plurality of delay elements 112a-112n include, but are not limited to, buffers, delay cells, and the like.

It will be apparent to a person skilled in the art that the scope of the present disclosure is not limited to the delay circuit 106 as illustrated in the FIG. 1. In various other embodiments, the delay circuit 106 may be realized using a different set of logic gates or components to achieve the same functionality as described in the foregoing description.

The pulse train generator 108 is an electronic circuit that is coupled to the clock source 102. The pulse train generator 108 is configured to receive the input clock $Clk_{in}$ from the clock source 102 and generate a pulse train P_Tr. The pulse train P_Tr includes a plurality of pulses aligned with a set of rising edges and a set of falling edges of the input clock $Clk_{in}$. The pulse train generator 108 includes an $n+1^{th}$ delay element 114 and first through third logic gates 116, 118, and 120.

The $n+1^{th}$ delay element 114 is coupled to the clock source 102, and configured to receive the input clock $Clk_{in}$ from the clock source 102 and generate a second delayed clock Dclk2. The $n+1^{th}$ delay element 114 is configured to delay the input clock $Clk_{in}$ by a second time-interval $t_2$ to generate the second delayed clock Dclk2. The second time-interval $t_2$ is greater than a minimum pulse width requirement of the failure detection circuit 110 and less than half of a clock period of the input clock $Clk_{in}$. In one embodiment, the $n+1^{th}$ delay element is a NOT gate.

The first logic gate 116 is coupled to the clock source 102 and the $n+1^{th}$ delay element 114, and configured to receive the input clock $Clk_{in}$ from the clock source 102 and the second delayed clock Dclk2 from the $n+1^{th}$ delay element 114. The first logic gate 116 is further configured to generate a first intermediate signal $FI_{sig}$. The first intermediate signal $FI_{sig}$ includes a first set of pulses aligned with the set of rising edges of the input clock $Clk_{in}$. In one embodiment, the first logic gate 116 is an AND gate and a pulse width of each pulse in the first intermediate signal $FI_{sig}$ is equal to the second time-interval $t_2$.

The second logic gate 118 is coupled to the clock source 102 and the $n+1^{th}$ delay element 114, and configured to receive the input clock $Clk_{in}$ from the clock source 102 and the second delayed clock Dclk2 from the $n+1^{th}$ delay element 114. The second logic gate 118 is further configured to generate a second intermediate signal $SI_{sig}$. The second intermediate signal $SI_{sig}$ includes a second set of pulses aligned with the set of falling edges of the input clock $Clk_{in}$. In one embodiment, the second logic gate 118 is a NOR gate and a pulse width of each pulse in the second intermediate signal $SI_{sig}$ is equal to the second time-interval $t_2$.

The third logic gate 120 is coupled to the first and second logic gates 116 and 118, and configured to receive the first and second intermediate signals $FI_{sig}$ and $SI_{sig}$ from the respective first and second logic gates 116 and 118. The third logic gate 120 is further configured to generate the pulse train P_Tr. In one embodiment, the third logic gate 120 is an OR gate. Thus, the pulse train P_Tr is an ORed combination of the first and second intermediate signals $FI_{sig}$ and $SI_{sig}$, and each of the plurality of pulses of the pulse train P_Tr has a pulse width corresponding to (i.e., equal to) the second time-interval $t_2$.

It will be apparent to a person skilled in the art that the scope of the present disclosure is not limited to the pulse train generator 108 as illustrated in FIG. 1. In various other embodiments, the pulse train generator 108 may be realized using a different set of logic gates to achieve the same functionality as described in the foregoing description.

The failure detection circuit 110 is coupled to the delay circuit 106 and the pulse train generator 108. The failure detection circuit 110 is configured to receive the pulse train P_Tr from the pulse train generator 108 and the first delayed clock Dclk1 from the delay circuit 106, and generate a clock detection signal $CD_{sig}$. The clock detection signal $CD_{sig}$ transitions from a first logic state (e.g., a logic low state) to a second logic state (e.g., a logic high state) based on a clock failure in the input clock $Clk_{in}$. The failure detection circuit 110 includes a first reset synchronizer circuit 122, a second reset synchronizer circuit 124, and fourth and fifth logic gates 126 and 128.

The first reset synchronizer circuit 122 is coupled to the pulse train generator 108 and the delay circuit 106. The first reset synchronizer circuit 122 is configured to receive the pulse train P_Tr from the pulse train generator 108 and the first delayed clock Dclk1 from the delay circuit 106, and generate a first detection signal $FD_{sig}$. The first detection signal $FD_{sig}$ transitions from the first logic state to the second logic state based on the clock failure during a first phase of the input clock $Clk_{in}$. In one embodiment, the first phase is a low phase of the input clock $Clk_{in}$. The first reset synchronizer circuit 122 includes a first flip-flop 130 and a second flip-flop 132. The first flip-flop 130 is a positive edge triggered flip-flop and the second flip-flop 132 is a negative edge triggered flip-flop.

In one embodiment, the first flip-flop 130 is a data flip-flop (D flip-flop). The first flip-flop 130 has a first reset terminal that is coupled to the pulse train generator 108 and configured to receive the pulse train P_Tr. The first flip-flop 130 further has a first clock terminal that is coupled to the delay circuit 106 and configured to receive the first delayed clock Dclk1, and a first input terminal that is configured to receive a voltage input $V_{DD}$. In one example, the voltage input $V_{DD}$ may be 5 volts. At every rising edge of the pulse train P_Tr, the first flip-flop 130 is reset. The first flip-flop 130 further has a first output terminal that is configured to generate a first flip-flop output $FF_{out}$ based on the pulse train P_Tr, the first delayed clock Dclk1, and the voltage input $V_{DD}$.

In one embodiment, the second flip-flop 132 is a D flip-flop. The second flip-flop 132 has a second reset terminal that is coupled to the pulse train generator 108 and configured to receive the pulse train P_Tr, and a second clock terminal that is configured to receive an inverted version of the first delayed clock Dclk1. The second flip-flop 132 further has a second input terminal that is coupled to the first flip-flop 130 and configured to receive the first flip-flop output $FF_{out}$. At every rising edge of the pulse train P_Tr, the second flip-flop 132 is reset. The second flip-flop 132 further has a second output terminal that is configured to generate the first detection signal $FD_{sig}$ based on the first flip-flop output $FF_{out}$, the pulse train P_Tr, and the inverted version of the first delayed clock Dclk1.

The second reset synchronizer circuit 124 is coupled to the pulse train generator 108 and the delay circuit 106. The second reset synchronizer circuit 124 is configured to receive the pulse train P_Tr from the pulse train generator 108 and the first delayed clock Dclk1 from the delay circuit 106, and generate a second detection signal $SD_{sig}$. The second detection signal $SD_{sig}$ transitions from the first logic state to the second logic state based on the clock failure during a second phase of the input clock $Clk_{in}$. In one embodiment, the second phase is a high phase of the input clock $Clk_{in}$. The second reset synchronizer circuit 124 includes a third flip-flop 134 and a fourth flip-flop 136. The third flip-flop 134 is a negative edge triggered flip-flop and the fourth flip-flop 136 is a positive edge triggered flip-flop.

In one embodiment, the third flip-flop 134 is a D flip-flop. The third flip-flop 134 has a third reset terminal that is coupled to the pulse train generator 108 and configured to receive the pulse train P_Tr. The third flip-flop 134 further has a first clock terminal that is configured to receive the inverted version of the first delayed clock Dclk1 and a third input terminal that is configured to receive the voltage input $V_{DD}$. At every rising edge of the pulse train P_Tr, the third flip-flop 134 is reset. The third flip-flop 134 further has a third output terminal that is configured to generate a second flip-flop output $SF_{out}$ based on the pulse train P_Tr, the inverted version of the first delayed clock Dclk1, and the voltage input $V_{DD}$.

In one embodiment, the fourth flip-flop 136 is a D flip-flop. The fourth flip-flop 136 has a fourth reset terminal that is coupled to the pulse train generator 108 and configured to receive the pulse train P_Tr, and a fourth clock terminal that is coupled to the delay circuit 106 and configured to receive the first delayed clock Dclk1. The fourth flip-flop 136 further has a fourth input terminal that is coupled to the third flip-flop 134 and configured to receive the second flip-flop output $SF_{out}$. At every rising edge of the pulse train P_Tr, the fourth flip-flop 136 is reset. The fourth flip-flop 136 further has a fourth output terminal that is configured to generate the second detection signal $SD_{sig}$ based on the second flip-flop output $SF_{out}$, the pulse train P_Tr, and the first delayed clock Dclk1. The pulse train P_Tr has the pulse width that satisfies minimum pulse width requirements of the first through fourth reset terminals. Thus, the second time-interval $t_2$ is configured in such a manner that the minimum pulse width requirements of the first through fourth reset terminals is satisfied.

The first and second reset synchronizer circuits 122 and 124 are further coupled to the fourth logic gate 126. The fourth logic gate 126 is configured to receive the first and second detection signals $FD_{sig}$ and $SD_{sig}$ and generate a third detection signal $TD_{sig}$. In one embodiment, the fourth logic gate 126 is an OR gate. Thus, the third detection signal $TD_{sig}$ is an ORed combination of the first and second detection signals $FD_{sig}$ and $SD_{sig}$. The fourth logic gate 126 is further coupled to the fifth logic gate 128.

The fifth logic gate 128 is configured to receive an enable input En and the third detection signal $TD_{sig}$ and generate the clock detection signal $CD_{sig}$. The clock failure detection system 104 is enabled or disabled based on the enable input En. For example, when the enable input En is active (e.g., at a logic high state), the clock failure detection system 104 is enabled to detect clock failure and when the enable input En is inactive (e.g., at a logic low state), the clock failure detection system 104 is disabled. In one embodiment, the fifth logic gate 128 is an AND gate. The fifth logic gate 128 performs an AND operation on the enable input En and the third detection signal $TD_{sig}$ to generate the clock detection signal $CD_{sig}$. Thus, when the enable input En is active, the clock detection signal $CD_{sig}$ transitions from the first logic state to the second logic state when the third detection signal $TD_{sig}$ transitions from the first logic state to the second logic state.

In one embodiment, the clock detection signal $CD_{sig}$ may be stored in memory for maintaining a log of the clock failure. Further, the clock detection signal $CD_{sig}$ may be routed to a fault handler (not shown). The fault handler, upon receiving the clock detection signal $CD_{sig}$, is configured to initiate a recovery mechanism to recover the input clock $Clk_{in}$ from the clock failure.

Figure 2:
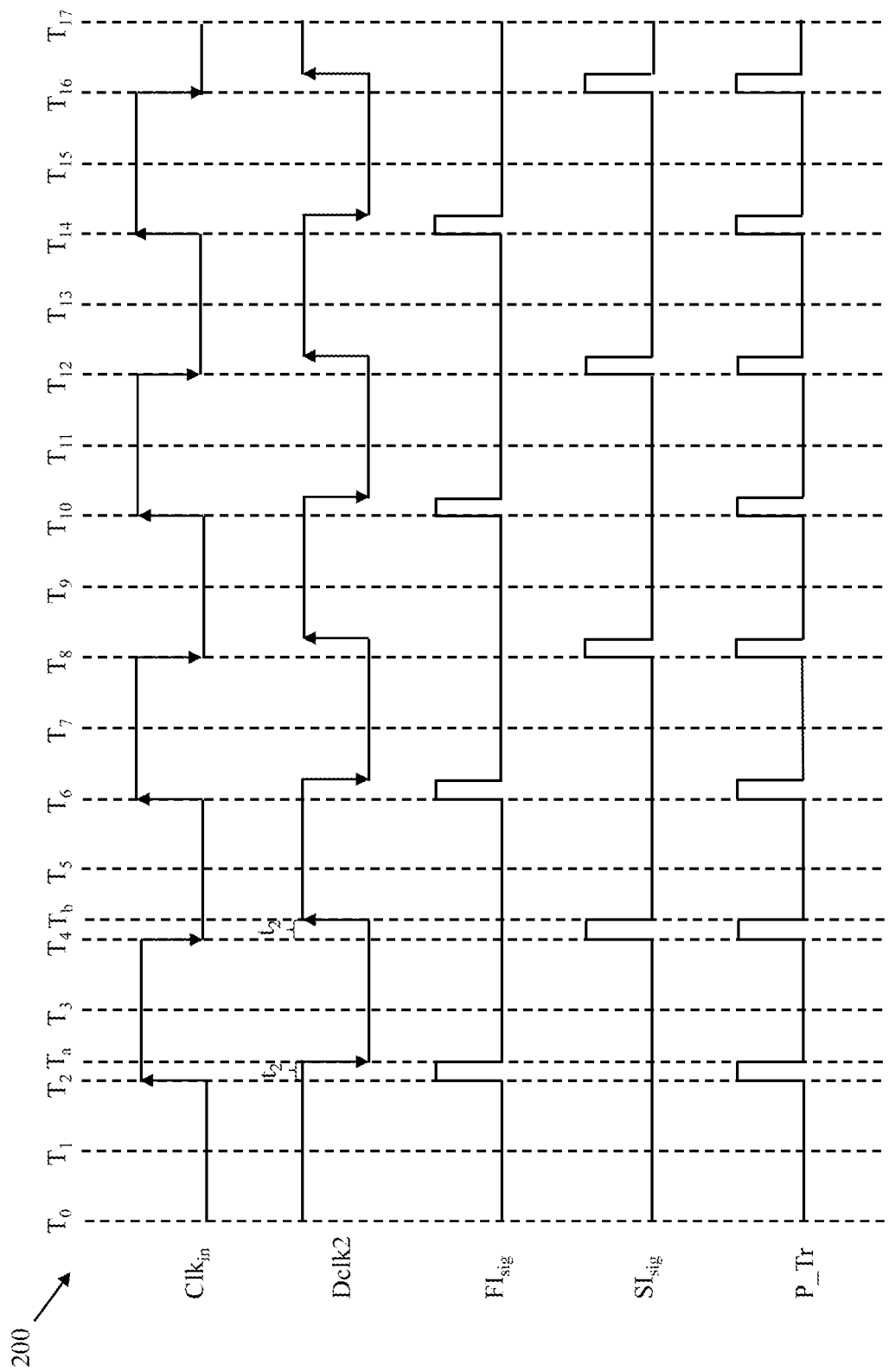
FIG. 2 is a timing diagram that illustrates an operation of a pulse train generator of the SoC of FIG. 1 in accordance with an embodiment of the present disclosure.

FIG. 2 is a timing diagram 200 that illustrates an operation of the pulse train generator 108, in accordance with an embodiment of the present disclosure. During time period $T_0$-$T_{17}$, the pulse train generator 108 receives the input clock $Clk_{in}$ from the clock source 102. The n+1$^{th}$ delay element 114 delays the input clock $Clk_{in}$ by the second time-interval $t_2$ to generate the second delayed clock Dclk2.

During time period $T_0$-$T_2$, the input clock $Clk_{in}$ is at logic low state and the second delayed clock Dclk2 is at logic high state. Since the first intermediate signal $FI_{sig}$ is generated based on an AND operation between the input clock $Clk_{in}$ and the second delayed clock Dclk2, the first intermediate signal $FI_{sig}$ remains at logic low state during the time period $T_0$-$T_2$. Since the second intermediate signal $SI_{sig}$ is generated based on a NOR operation between the input clock $Clk_{in}$ and the second delayed clock Dclk2, the second intermediate signal $SI_{sig}$ remains at logic low state during the time period $T_0$-$T_2$. As the pulse train P_Tr is generated based on an OR operation between the first and second intermediate signals $FI_{sig}$ and $SI_{sig}$, the pulse train P_Tr remains at logic low state during the time period $T_0$-$T_2$.

At time instance $T_2$, the input clock $Clk_{in}$ transitions from logic low state to logic high state (i.e., a rising edge occurs) whereas the second delayed clock Dclk2 remains at logic high state. As a result, the first intermediate signal $FI_{sig}$ and the pulse train P_Tr transition from logic low state to logic high state. However, the second intermediate signal $SI_{sig}$ remains at logic low state.

At time instance $T_a$ (where, $T_a = T_2 + t_2$), the second delayed clock Dck2 transitions from logic high state to logic low state whereas the input clock $Clk_{in}$ remains at logic high state. As a result, the first intermediate signal $FI_{sig}$ and the pulse train P_Tr transition from logic high state to logic low state. The second intermediate signal $SI_{sig}$ continues to remain at logic low state. Thus, during the time period $T_2$-$T_a$, a pulse that has a pulse width equal to the second time-interval $t_2$ is formed in each of the first intermediate signal $FI_{sig}$ and the pulse train P_Tr. The pulse is aligned with the rising edge of the input clock $Clk_{in}$ at the time instance $T_2$.

During time period $T_a$-$T_4$, the input clock $Clk_{in}$ is at logic high state and the second delayed clock Dclk2 is at logic low state. As a result, the first intermediate signal $FI_{sig}$, the second intermediate signal $SI_{sig}$, and the pulse train P_Tr remain at logic low state.

At time instance $T_4$, the input clock $Clk_{in}$ transitions from logic high state to logic low state (i.e., a falling edge occurs) whereas the second delayed clock Dclk2 remains at logic low state. As a result, the second intermediate signal $SI_{sig}$ and the pulse train P_Tr transition from logic low state to logic high state. However, the first intermediate signal $FI_{sig}$ remains at logic low state.

At time instance $T_b$ (where, $T_b = T_4 + t_2$), the second delayed clock Dclk2 transitions from logic low state to logic high state whereas the input clock $Clk_{in}$ remains at logic low state. As a result, the second intermediate signal $SI_{sig}$ and the pulse train P_Tr transition from logic high state to logic low state. The first intermediate signal $FI_{sig}$ continues to remain at logic low state. Thus, during the time period $T_4$-$T_b$, another pulse that has a pulse width equal to the second time-interval $t_2$ is formed in each of the second intermediate signal $SI_{sig}$ and the pulse train P_Tr. The pulse is aligned with the falling edge of the input clock $Clk_{in}$ at the time instance $T_4$.

Similarly, due to rising edges of the input clock $Clk_{in}$ at time instances $T_6$, $T_{10}$, and $T_{14}$, pluses having the pulse width equal to the second time-interval $t_2$ are formed in the first intermediate signal $FI_{sig}$ and the pulse train P_Tr. Further, due to falling edges of the input clock $Clk_{in}$ at time instances $T_8$, $T_{12}$, and $T_{16}$, pluses having the pulse width equal to the second time-interval $t_2$ are formed in the second intermediate signal $SI_{sig}$ and the pulse train P_Tr.

Figure 3:
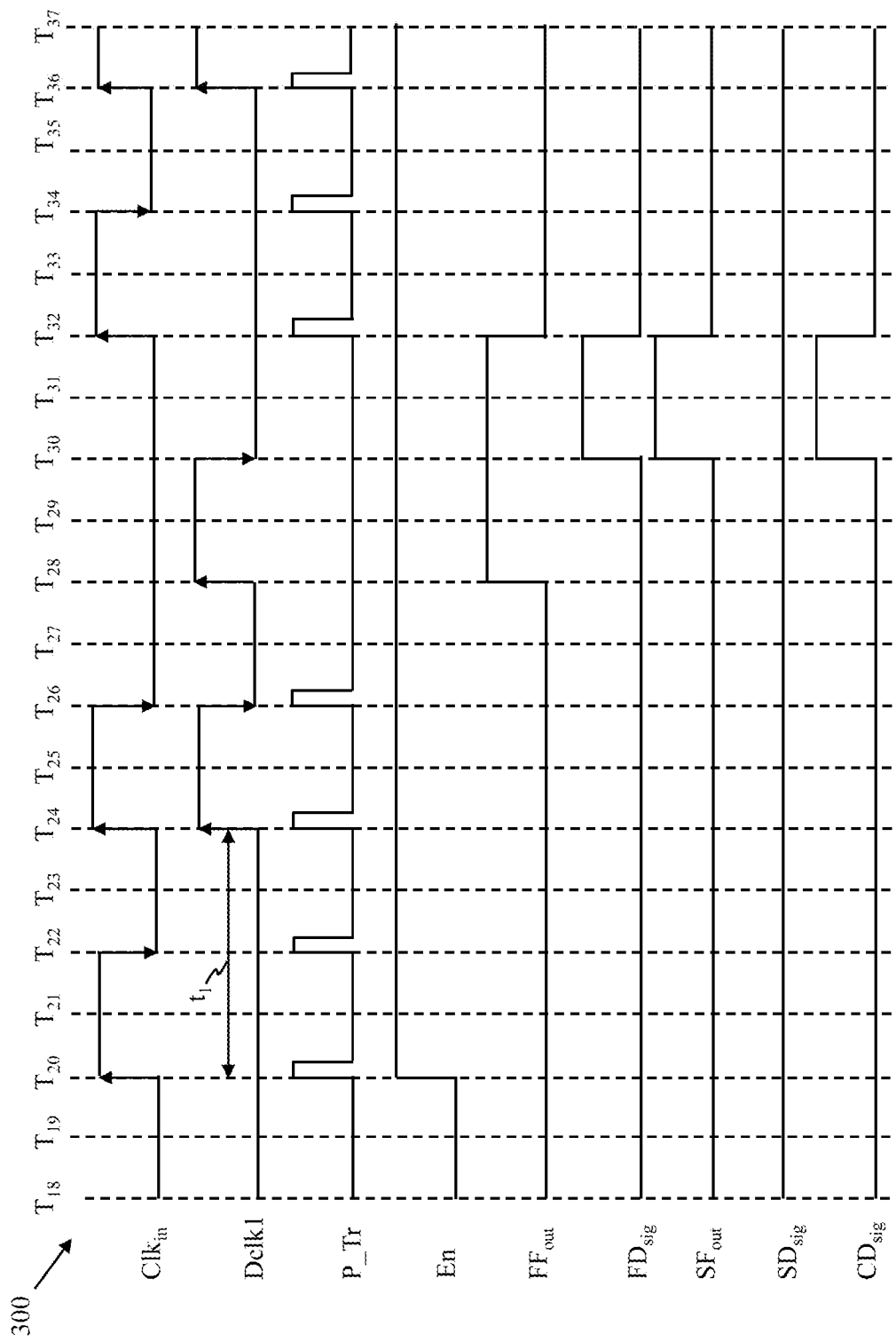
FIG. 3 is a timing diagram that illustrates an operation of a clock failure detection system of the SoC of FIG. 1 when a temporary clock failure occurs during a first phase of an input clock in accordance with an embodiment of the present disclosure.

FIG. 3 is a timing diagram 300 that illustrates an operation of the clock failure detection system 104 when the temporary clock failure occurs during the first phase of the input clock $Clk_{in}$ accordance with an embodiment of the present disclosure. The first phase is the low phase of the input clock $Clk_{in}$.

During time period $T_{18}$-$T_{28}$, the input clock $Clk_{in}$ operates normally without any clock failure. The rising edges of the input clock $Clk_{in}$ occur at time instances $T_{20}$ and $T_{24}$ and the falling edges of the input clock $Clk_{in}$ occur at time instances $T_{22}$ and $T_{26}$. Since the first delayed clock Dclk1 is generated by delaying the input clock $Clk_{in}$ by the first time-interval $t_1$ (e.g., one clock period of the input clock $Clk_{in}$), the rising edges of the first delayed clock Dclk1 occur at time instances $T_{24}$ and $T_{28}$ and the falling edges of the first delayed clock Dclk1 occur at time instances $T_{26}$ and $T_{30}$. Since pulses in the pulse train P_Tr are aligned with the rising and falling edges of the input clock $Clk_{in}$, the pulses occur at time instances $T_{20}$, $T_{22}$, $T_{24}$, and $T_{26}$. The enable input En is activated at time instance $T_{20}$ to enable the clock failure detection system 104. At time instances $T_{20}$, $T_{22}$, $T_{24}$, and $T_{26}$, the pulse train P_Tr resets the first through fourth flip-flops 130, 132, 134, and 136. As a result, the first flip-flop output $FF_{out}$, the first detection signal $FD_{sig}$, the second flip-flop output $SF_{out}$, and the second detection signal $SD_{sig}$ remain at logic low state during time period $T_{18}$-$T_{26}$. As a result, the clock detection signal $CD_{sig}$ remains at logic low state during time period $T_{18}$-$T_{26}$.

At time instance $T_{28}$, the input clock $Clk_{in}$ fails to transit from logic low state to logic high state. Thus, a clock failure is observed at the low phase of the input clock $Clk_{in}$. Due to the clock failure, rising and falling edges are absent in the input clock $Clk_{in}$ at time instances $T_{28}$ and $T_{30}$. As a result, no pulse is present in the pulse train P_Tr at time instances $T_{28}$ and $T_{30}$ to reset the first through fourth flip-flops 130, 132, 134, and 136.

At time instance $T_{28}$, the first delayed clock Dclk1 transitions from logic low state to logic high state. The first flip-flop 130 is triggered by the rising edge of the first delayed clock Dclk1, and as a result, the first flip-flop output $FF_{out}$ transitions from logic low state to logic high state. Since the second flip-flop 132 is negative edge triggered, the first detection signal $FD_{sig}$ remains at logic low state. Further, as the third flip-flop 134 is negative edge triggered, the second flip-flop output $SF_{out}$ remains at logic low state, and as a result the second detection signal $SD_{sig}$ remains at logic low state. The clock detection signal $CD_{sig}$ also remains at logic low state.

At time instance $T_{30}$, the first delayed clock Dclk1 transitions from logic high state to logic low state and the first flip-flop output $FF_{out}$ remains at logic high state. The second flip-flop 132 is triggered by the falling edge of the first delayed clock Dclk1, and as a result, the first detection signal $FD_{sig}$ transitions from logic low state to logic high state. Similarly, the third flip-flop 134 is triggered by the falling edge of the first delayed clock Dclk1, and as a result, the second flip-flop output $SF_{out}$ transitions from logic low state to logic high state. However, the second detection signal $SD_{sig}$ remains at logic low state. Due to the transition in the first detection signal $FD_{sig}$, the clock detection signal $CD_{sig}$ also transitions from logic low state to logic high state, thus indicating the clock failure in the input clock $Clk_{in}$.

During time period $T_3$-$T_{32}$, the first flip-flop output $FF_{out}$, the first detection signal $FD_{sig}$, the second flip-flop output $SF_{out}$, and the clock detection signal $CD_{sig}$ remain at logic high state. The second detection signal $SD_{sig}$ remains at logic low state.

At time instance $T_{32}$, the input clock $Clk_{in}$ recovers from the clock failure, and as a result, a rising edge is observed in the input clock $Clk_{in}$. Thus, the pulse train P_Tr includes a pulse at time instance $T_{32}$. The first through fourth flip-flops 130, 132, 134, and 136 are reset by the pulse train P_Tr. As a result, the first flip-flop output $FF_{out}$, the first detection signal $FD_{sig}$, and the second flip-flop output $SF_{out}$ transition from logic high state to logic low state. The second detection signal $SD_{sig}$ remains at logic low state. The clock detection signal $CD_{sig}$ also transitions from logic high state to logic low state, indicating recovery from the clock failure.

Figure 4:
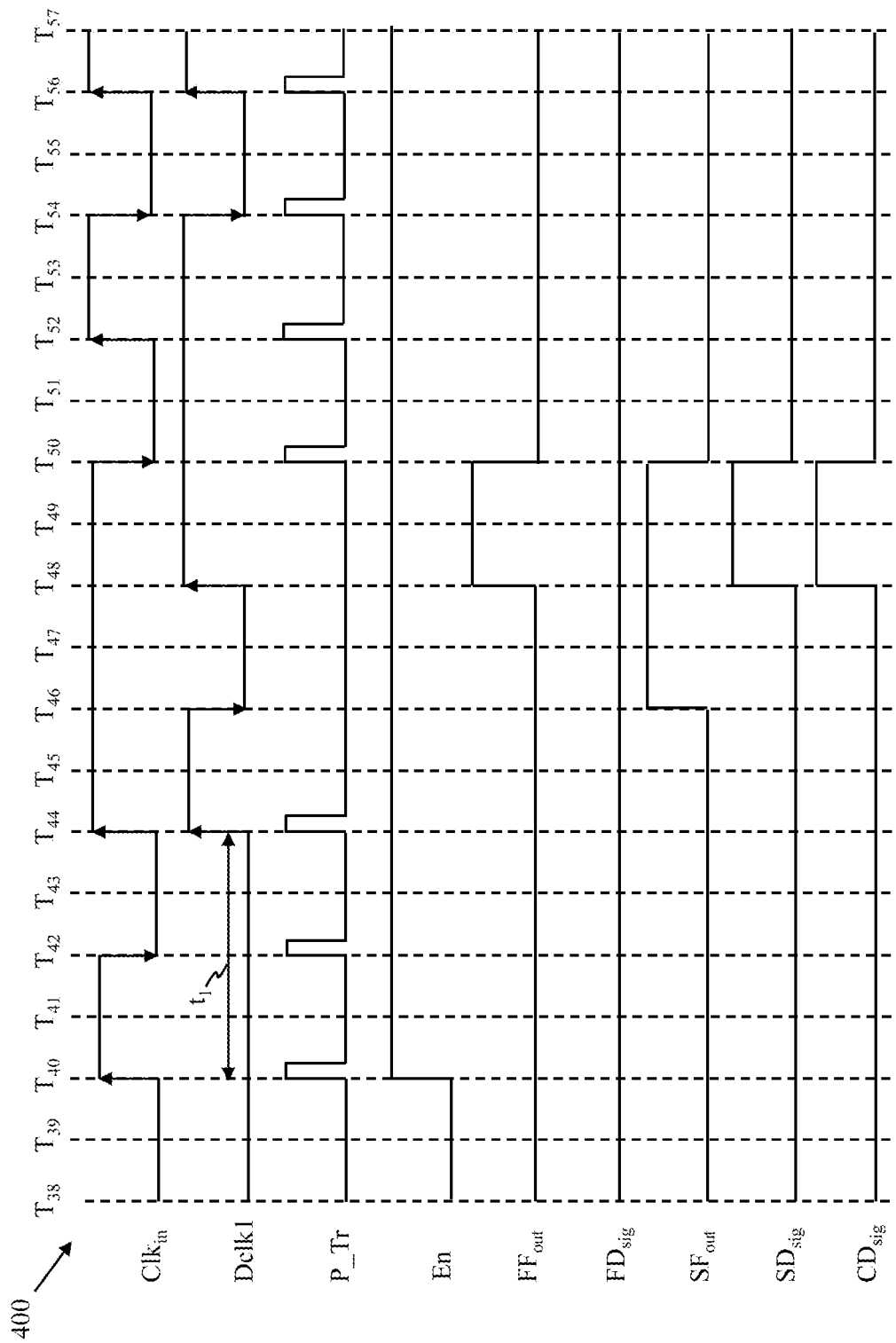
FIG. 4 is a timing diagram that illustrates an operation of the clock failure detection system of the SoC of FIG. 1 when the temporary clock failure occurs during a second phase of the input clock in accordance with an embodiment of the present disclosure.

FIG. 4 is a timing diagram 400 that illustrates an operation of the clock failure detection system 104 when the temporary clock failure occurs during the second phase of the input clock $Clk_{in}$, accordance with an embodiment of the present disclosure. In one embodiment, the second phase is the high phase of the input clock $Clk_{in}$.

During time period $T_{38}$-$T_{46}$, the input clock $Clk_{in}$ operates normally without any clock failure. The rising edges of the input clock $Clk_{in}$ occur at time instances $T_{40}$ and $T_{44}$ and the falling edges of the input clock $Clk_{in}$ occur at time instance $T_{42}$. Since the first delayed clock Dclk1 is generated by delaying the input clock $Clk_{in}$ by the first time-interval $t_1$ (e.g., one clock period of the input clock $Clk_{in}$), the rising edges of the first delayed clock Dclk1 occur at time instances $T_{44}$ and $T_{48}$ and the falling edge of the first delayed clock Dclk1 occur at time instance $T_{46}$. Since pulses in the pulse train P_Tr are aligned with the rising and falling edges of the input clock $Clk_{in}$, the pulses occur at time instances $T_{40}$, $T_{42}$, and $T_{44}$. The enable input En is activated at time instance $T_{40}$ to enable the clock failure detection system 104. At time instances $T_{40}$, $T_{42}$, and $T_{44}$, the pulse train P_Tr resets the first through fourth flip-flops 130, 132, 134, and 136. As a result, the first flip-flop output $FF_{out}$, the first detection signal $FD_{sig}$, the second flip-flop output $SF_{out}$, and the second detection signal $SD_{sig}$ remain at logic low state during time period $T_{38}$-$T_{44}$. As a result, the clock detection signal $CD_{sig}$ remains at logic low state during time period $T_{38}$-$T_{44}$.

At time instance $T_{46}$, the input clock $Clk_{in}$ fails to transition from logic high state to logic low state. Thus, a clock failure is observed at the high phase of the input clock $Clk_{in}$. Due to the clock failure, rising and falling edges at time instances $T_{46}$ and $T_{48}$ are absent. As a result, no pulse is present in the pulse train P_Tr at time instances $T_{46}$ and $T_{48}$ to reset the first through fourth flip-flops 130, 132, 134, and 136.

At time instance $T_{46}$, the first delayed clock Dclk1 transitions from logic high state to logic low state. Since the first flip-flop 130 is positive edge trigged, the first flip-flop output $FF_{out}$ remains at logic low state, and as a result the first detection signal $FD_{sig}$ remains at logic low state. Further, as the third flip-flop 134 is negative edge triggered, the third flip-flop 134 is triggered by the falling edge of the first delayed clock Dclk1 and the second flip-flop output $SF_{out}$ transitions from logic low state to logic high state. Since the fourth flip-flop 136 is positive edge triggered, the second detection signal $SD_{sig}$ remains at logic low state. The clock detection signal $CD_{sig}$ also remains at logic low state.

At time instance $T_{48}$, the first delayed clock Dclk1 transitions from logic low state to logic high state and the second flip-flop output $SF_{out}$, remains at logic high state. The first flip-flop 130 is triggered by the rising edge of the first delayed clock Dclk1, and as a result, the first flip-flop output $FF_{out}$ transitions from logic low state to logic high state. However, the first detection signal $FD_{sig}$ remains at logic low state. The fourth flip-flop 136 is triggered by the rising edge of the first delayed clock Dclk1, and as a result, the second detection signal $SD_{sig}$ transitions from logic low state to logic high state. Due to transition in the second detection signal $SD_{sig}$, the clock detection signal $CD_{sig}$ also transitions from logic low state to logic high state, thus indicating the clock failure in the input clock $Clk_{in}$.

During time period $T_{48}$-$T_{50}$, the first flip-flop output $FF_{out}$, the second flip-flop output $SF_{out}$, the second detection signal $SD_{sig}$, and the clock detection signal $CD_{sig}$ remain at logic high state. The first detection signal $FD_{sig}$ remains at logic low state.

At time instance $T_{50}$, the input clock $Clk_{in}$ recovers from the clock failure, and as a result, a falling edge is observed in the input clock $Clk_{in}$. Thus, the pulse train P_Tr includes a pulse at time instance $T_{50}$. The first through fourth flip-flops 130, 132, 134, and 136 are reset by the pulse train P_Tr. As a result, the first flip-flop output $FF_{out}$, the second flip-flop output $SF_{out}$, and the second detection signal $SD_{sig}$, transition from logic high state to logic low state. The first detection signal $FD_{sig}$ remains at logic low state. The clock detection signal $CD_{sig}$ also transitions from logic high state to logic low state, indicating recovery from the clock failure.

Figure 5:
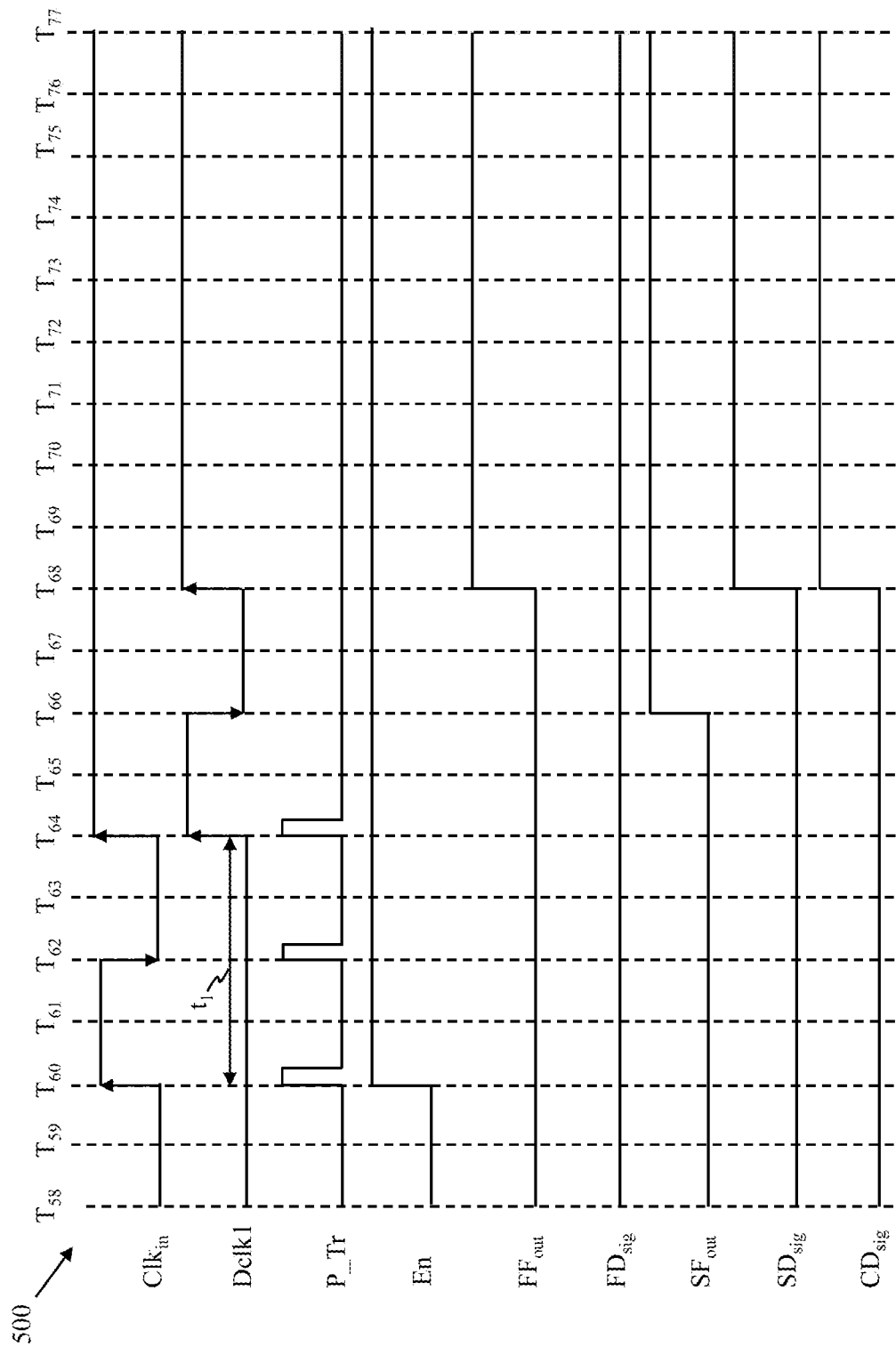
FIG. 5 is a timing diagram that illustrates an operation of the clock failure detection system of the SoC of FIG. 1 when a permanent clock failure occurs in the input clock in accordance with an embodiment of the present disclosure.

FIG. 5 is a timing diagram 500 that illustrates an operation of the clock failure detection system 104 when a permanent clock failure occurs in the input clock $Clk_{in}$ in accordance with an embodiment of the present disclosure.

During time period $T_{58}$-$T_{66}$, the input clock $Clk_{in}$ operates normally without any clock failure. The rising edges of the input clock $Clk_{in}$ occur at time instances $T_{60}$ and $T_{64}$ and the falling edge of the input clock $Clk_{in}$ occurs at time instance $T_{62}$. Since the first delayed clock Dclk1 is generated by delaying the input clock $Clk_{in}$ by the first time-interval $t_1$ (e.g., one clock period of the input clock $Clk_{in}$), the rising edges of the first delayed clock Dclk1 occur at time instances $T_{64}$ and $T_{68}$ and the falling edge of the first delayed clock Dclk1 occurs at time instance $T_{66}$. Since pulses in the pulse train P_Tr are aligned with the rising and falling edges of the input clock $Clk_{in}$, the pulses occur at time instances $T_{60}$, $T_{62}$, and $T_{64}$. The enable input En is activated at time instance $T_{60}$ to enable the clock failure detection system 104. At time instances $T_{60}$, $T_{62}$, and $T_{64}$, the pulse train P_Tr resets the first through fourth flip-flops 130, 132, 134, and 136. As a result, the first flip-flop output $FF_{out}$, the first detection signal $FD_{sig}$, the second flip-flop output $SF_{out}$, and the first detection signal $FD_{sig}$ remain at logic low state during time period $T_{58}$-$T_{64}$. As a result, the clock detection signal $CD_{sig}$ remains at logic low state during time period $T_{58}$-$T_{64}$.

At time instance $T_{66}$, the input clock $Clk_{in}$ fails to transition from logic high state to logic low state. Thus, a clock failure is observed at the high phase of the input clock $Clk_{in}$. Due to the clock failure, rising and falling edges during time period $T_{66}$-$T_{77}$ are absent. As a result, no pulse is present in the pulse train P_Tr during time period $T_{66}$-$T_{77}$.

At time instance $T_{66}$, the first delayed clock Dclk1 transitions from logic high state to logic low state. Since the first flip-flop 130 is positive edge trigged, the first flip-flop output $FF_{out}$ remains at logic low state, and as a result the first detection signal $FD_{sig}$ remains at logic low state. Further, as the third flip-flop 134 is negative edge triggered, the second flip-flop output $SF_{out}$ transitions from logic low state to logic high state. Since the fourth flip-flop 136 is positive edge triggered, the second detection signal $SD_{sig}$ remains at logic low state. The clock detection signal $CD_{sig}$ also remains at logic low state.

At time instance $T_{68}$, the first delayed clock Dclk1 transitions from logic low state to logic high state and the second flip-flop output $SF_{out}$ remains at logic high state. The first flip-flop 130 is triggered by the rising edge of the first delayed clock Dclk1, and as a result the first flip-flop output $FF_{out}$ transitions from logic low state to logic high state. However, the first detection signal $FD_{sig}$ remains at logic low state. The fourth flip-flop 136 is triggered by the rising edge of the first delayed clock Dclk1, and as a result, the second detection signal $SD_{sig}$ transitions from logic low state to logic high state. Due to transition in the second detection signal $SD_{sig}$, the clock detection signal $CD_{sig}$ also transitions from logic low state to logic high state, thus indicating the clock failure in the input clock $Clk_{in}$.

During time period $T_{68}$-$T_{77}$, the input clock $Clk_{in}$ fails to recover and the first flip-flop output $FF_{out}$, the second flip-flop output $SF_{out}$, and the second detection signal $SD_{sig}$ remain at logic high state. Hence, the clock detection signal $CD_{sig}$ also retains the logic high state. Therefore, the permanent clock failure is detected in the input clock $Clk_{in}$.

Figure 6A:
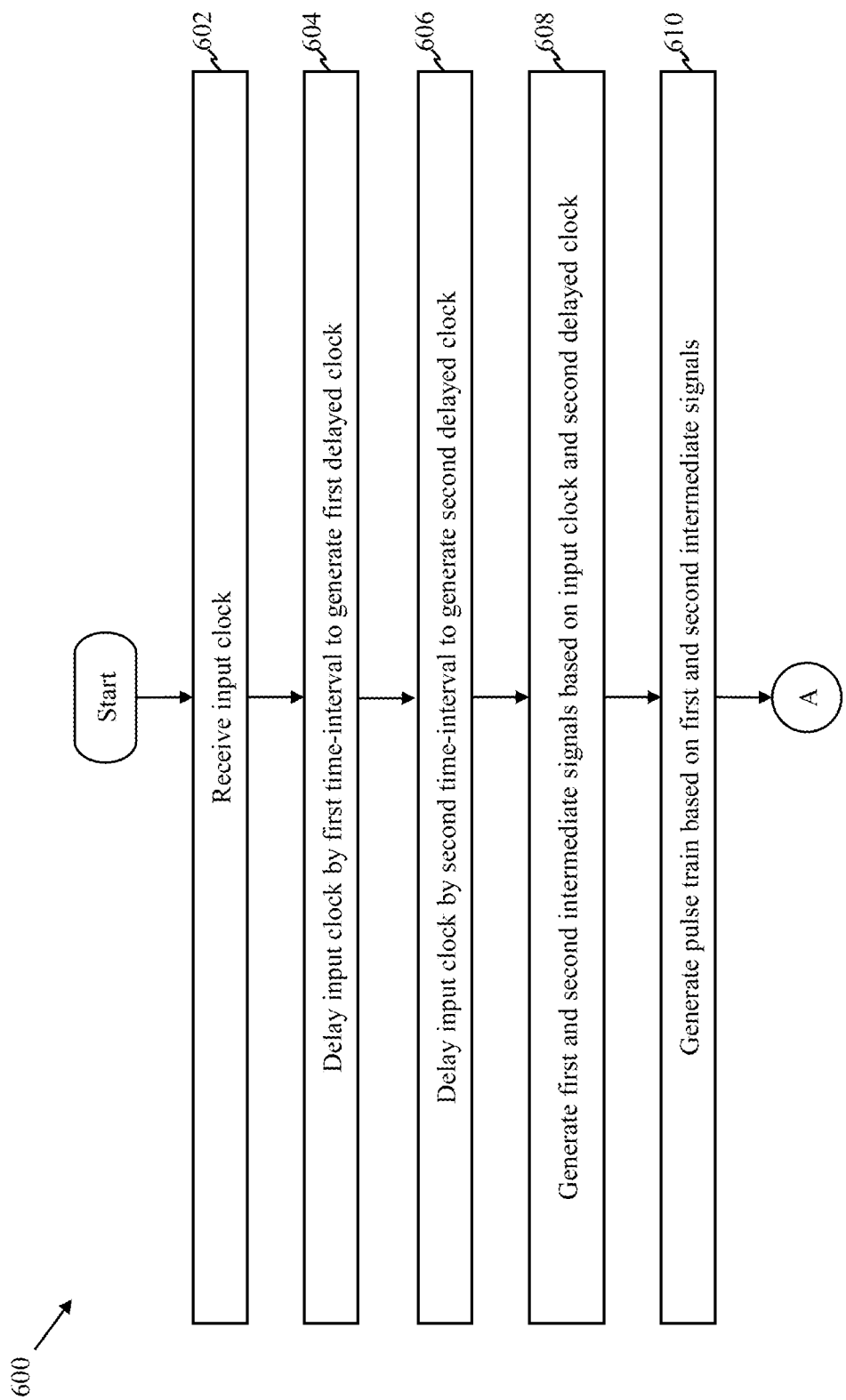
FIGS. 6A and 6B, collectively represent a flowchart that illustrates a method for detecting clock failure in accordance with an embodiment of the present disclosure.
Figure 6B:
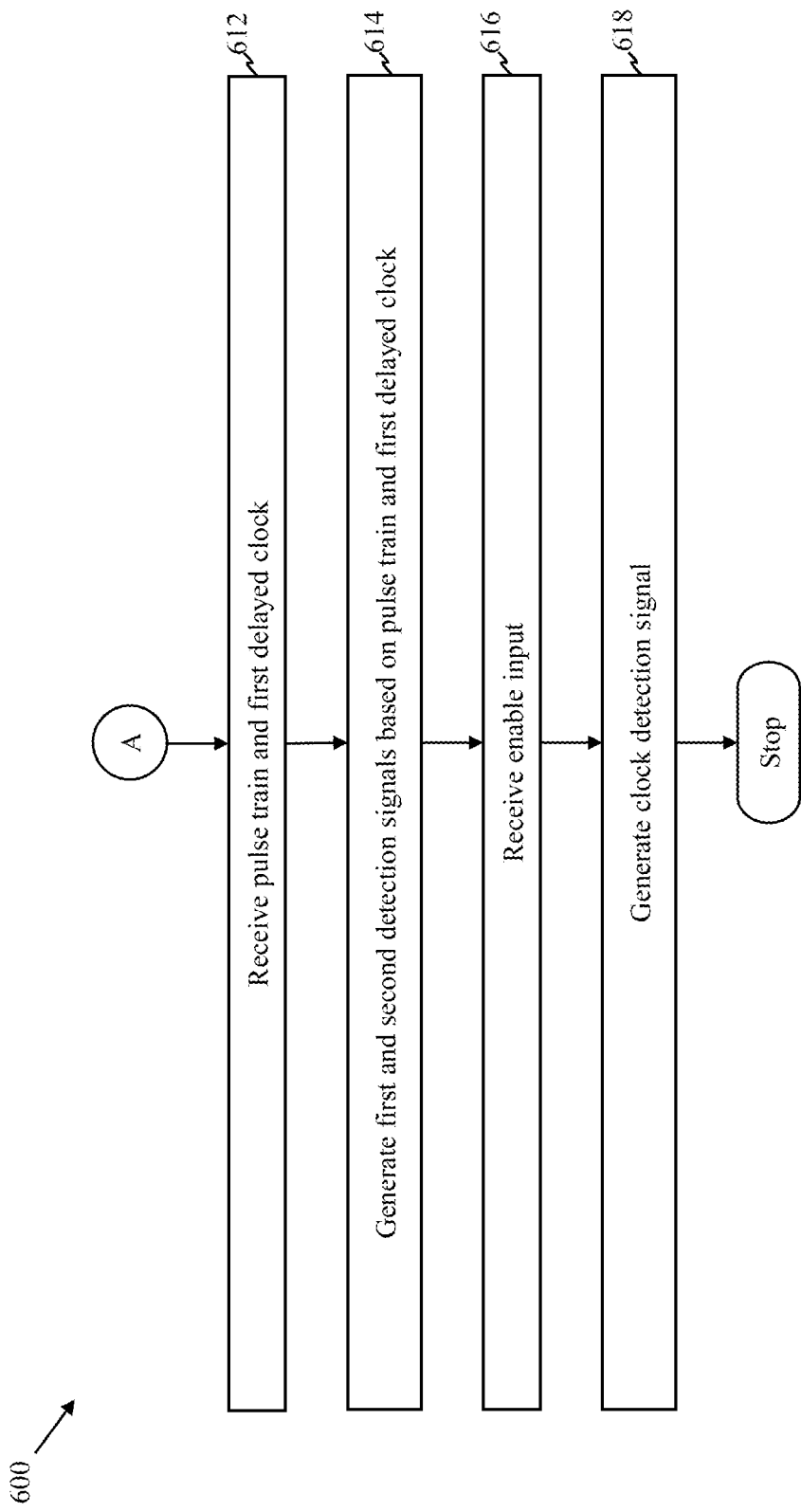

FIGS. 6A and 6B, collectively represent a flowchart 600 that illustrates a method for detecting clock failure in accordance with an embodiment of the present disclosure.

At step 602, the input clock $Clk_{in}$ is received by the delay circuit 106 and the pulse train generator 108 from the clock source 102. At step 604, the input clock $Clk_{in}$ is delayed by the first time-interval $t_1$ to generate the first delayed clock Dclk1 by the delay circuit 106. At step 606, the input clock $Clk_{in}$ is delayed by the second time-interval $t_2$ to generate the second delayed clock Dclk2 by the pulse train generator 108. For example, the n+1$^{th}$ delay element 114 in the pulse train generator 108 delays the input clock $Clk_{in}$ by the second time-interval $t_2$. At step 608, the first intermediate signal $FI_{sig}$ and the second intermediate signal $SI_{sig}$ are generated based on the input clock $Clk_{in}$ and the second delayed clock Dclk2 by the pulse train generator 108. For example, the first logic gate 116 in the pulse train generator 108 generates the first intermediate signal $FI_{sig}$ and the second logic gate 118 in the pulse train generator 108 generates the second intermediate signal $SI_{sig}$. At step 610, the pulse train P_Tr is generated based on the first intermediate signal $FI_{sig}$ and the second intermediate signal $SI_{sig}$ by the pulse train generator 108. The third logic gate 120 in the pulse train generator 108 generates the pulse train P_Tr including the plurality of pulses aligned with the set of rising edges and the set of falling edges of the input clock $Clk_{in}$.

At step 612, the pulse train P_Tr and the first delayed clock Dclk1 are received by the failure detection circuit 110. At step 614, the first and second detection signals $FD_{sig}$ and $SD_{sig}$ are generated based on the pulse train P_Tr and the first delayed clock Dclk1 by the failure detection circuit 110. The first and second reset synchronizer circuits 122 and 124 in the failure detection circuit 110 generate the first and second detection signals $FD_{sig}$ and $SD_{sig}$, respectively. At step 616, the enable input En is received by the failure detection circuit 110. The clock failure detection system 104 is enabled or disabled based on the enable input En. For example, when the enable input En is active (e.g., at a logic high state), the clock failure detection system 104 is enabled to detect the clock failure and when the enable input En is inactive (e.g., at a logic low state), the clock failure detection system 104 is disabled.

At step 618, the clock detection signal $CD_{sig}$ is generated based on the first detection signal $FD_{sig}$, the second detection signal $SD_{sig}$, and the enable input En by the failure detection circuit 110. In other words, the clock detection signal $CD_{sig}$ is generated by the failure detection circuit 110 based on the pulse train P_Tr and the first delayed clock Dclk1.

The clock failure detection system 104 disclosed herein facilitates an uninterrupted monitoring of the input clock $Clk_{in}$ for detecting clock failure. The clock failure detection system 104 mitigates the need of any reference clock signal or analog circuitry for detecting failure in the input clock $Clk_{in}$, thus resulting in significant cost and size reduction as compared to conventional clock failure detection systems. Although, the clock failure detection system 104 is described herein to detect failure in a single clock, the clock failure detection system 104 is scalable to perform simultaneous monitoring of multiple clock inputs. Further, the clock failure detection system 104 is stable and robust, hence performs significantly well under all device conditions such as different temperature and humidity values. Further, use of dual flip-flops in each of the first and second reset synchronizer circuits 122 and 124 eliminates occurrence metastability issues in the clock failure detection system 104. Therefore, the clock failure detection system 104 is significantly immune to noise and variations in device parameters such as voltage, temperature, and the like. Therefore, the clock failure detection system 104 provides efficient and low-cost solution for detecting clock failure in the input clock $Clk_{in}$.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims.

The invention claimed is:

1. A system for detecting clock failure, the system comprising:
   a pulse train generator that is configured to receive an input clock and generate a pulse train including a plurality of pulses aligned with a set of rising edges and a set of falling edges of the input clock;
   a delay circuit that is configured to delay the input clock by a first time-interval to generate a first delayed clock; and
   a failure detection circuit that is coupled to the pulse train generator and the delay circuit, and configured to receive the pulse train and the first delayed clock, and generate a clock detection signal that transitions from a first logic state to a second logic state based on a failure in the input clock.

2. The system of claim 1, wherein the pulse train generator comprises:
   a first delay element that is configured to delay the input clock by a second time-interval to generate a second delayed clock;
   a first logic gate that is coupled to the first delay element, and configured to receive the second delayed clock and the input clock, and generate a first intermediate signal that includes a first set of pulses aligned with the set of rising edges of the input clock;
   a second logic gate that is coupled to the first delay element, and configured to receive the second delayed clock and the input clock, and generate a second intermediate signal that includes a second set of pulses aligned with the set of falling edges of the input clock; and
   a third logic gate that is coupled to the first and second logic gates, and configured to receive the first and second intermediate signals and generate the pulse train.

3. The system of claim 2, wherein each of the plurality of pulses of the pulse train have a first pulse width corresponding to the second time-interval.

4. The system of claim 2, wherein the first time-interval is greater than a clock period of the input clock and the second time-interval is less than half of the clock period.

5. The system of claim 1, wherein the delay circuit comprises a second plurality of delay elements that are coupled in a series arrangement, and configured to receive the input clock, delay the input clock by the first time-interval, and generate the first delayed clock.

6. The system of claim 1, wherein the failure detection circuit comprises:
   a first reset synchronizer circuit that is coupled to the pulse train generator and the delay circuit, and configured to receive the pulse train and the first delayed clock, and generate a first detection signal, wherein the first detection signal transitions from the first logic state to the second logic state based on the failure during a first phase of the input clock;
   a second reset synchronizer circuit that is coupled to the pulse train generator and the delay circuit, and configured to receive the pulse train and the first delayed clock, and generate a second detection signal, wherein the second detection signal transitions from the first logic state to the second logic state based on the failure during a second phase of the input clock;
   a fourth logic gate that is coupled to the first and second reset synchronizer circuits, and configured to receive the first and second detection signals, and generate a third detection signal; and
   a fifth logic gate that is coupled to the fourth logic gate, and configured to receive the third detection signal and an enable input, and generate the clock detection signal.

7. The system of claim 6, wherein the first reset synchronizer circuit comprises:
   a first flip-flop that has: (i) a first reset terminal that is coupled to the pulse train generator, and configured to receive the pulse train, (ii) a first clock terminal that is coupled to the delay circuit, and configured to receive the first delayed clock, and (iii) a first output terminal that is configured to generate a first flip-flop output; and
   a second flip-flop that has: (i) a first input terminal that is coupled to the first output terminal, and configured to receive the first flip-flop output, (ii) a second reset terminal that is coupled to the pulse train generator, and configured to receive the pulse train, (iii) a second clock terminal that is configured to receive an inverted version of the first delayed clock, and (iv) a second output terminal that is configured to generate the first detection signal.

8. The system of claim 6, wherein the second reset synchronizer circuit comprises:

a third flip-flop that has: (i) a third reset terminal that is coupled to the pulse train generator, and configured to receive the pulse train, (ii) a third clock terminal that is configured to receive an inverted version of the first delayed clock, and (iii) a third output terminal that is configured to generate a second flip-flop output; and a fourth flip-flop that has: (i) a second input terminal that is coupled to the third output terminal, and configured to receive the second flip-flop output, (ii) a fourth reset terminal that is coupled to the pulse train generator, and configured to receive the pulse train, (iii) a fourth clock terminal that is coupled to the delay circuit, and configured to receive the first delayed clock, and (iv) a fourth output terminal that is configured to generate the second detection signal.

9. The system of claim 6, wherein the first phase is a low phase of the input clock and the second phase is a high phase of the input clock.

10. A system-on-chip (SoC), comprising:
a clock source that is configured to generate an input clock;
a clock failure detection system that is coupled to the clock source, and configured to detect clock failure, the clock failure detection system comprising:
a pulse train generator that is configured to receive the input clock, and generate a pulse train including a plurality of pulses aligned with a set of rising edges and a set of falling edges of the input clock;
a delay circuit that is configured to delay the input clock by a first time-interval to generate a first delayed clock; and
a failure detection circuit that is coupled to the pulse train generator and the delay circuit, and configured to receive the pulse train and the first delayed clock, and generate a clock detection signal that transitions from a first logic state to a second logic state based on a failure in the input clock.

11. The SoC of claim 10, wherein the pulse train generator comprises:
a first delay element that is configured to delay the input clock by a second time-interval to generate a second delayed clock;
a first logic gate that is coupled to the first delay element, and configured to receive the second delayed clock and the input clock, and generate a first intermediate signal that includes a first set of pulses aligned with the set of rising edges of the input clock;
a second logic gate that is coupled to the first delay element, and configured to receive the second delayed clock and the input clock, and generate a second intermediate signal that includes a second set of pulses aligned with the set of falling edges of the input clock; and
a third logic gate that is coupled to the first and second logic gates, and configured to receive the first and second intermediate signals and generate the pulse train.

12. The SoC of claim 10, wherein the delay circuit comprises a second plurality of delay elements that are coupled in a series arrangement, and configured to receive the input clock, delay the input clock by the first time-interval, and generate the first delayed clock.

13. The SoC of claim 10, wherein the failure detection circuit comprises:
a first reset synchronizer circuit that is coupled to the pulse train generator and the delay circuit, and configured to receive the pulse train and the first delayed clock, and generate a first detection signal, wherein the first detection signal transitions from the first logic state to the second logic state based on the failure during a first phase of the input clock;
a second reset synchronizer circuit that is coupled to the pulse train generator and the delay circuit, and configured to receive the pulse train and the first delayed clock, and generate a second detection signal, wherein the second detection signal transitions from the first logic state to the second logic state based on the failure during a second phase of the input clock;
a fourth logic gate that is coupled to the first and second reset synchronizer circuits, and configured to receive the first and second detection signals, and generate a third detection signal; and
a fifth logic gate that is coupled to the fourth logic gate, and configured to receive the third detection signal and an enable input, and generate the clock detection signal.

14. The SoC of claim 13, wherein the first reset synchronizer circuit comprises:
a first flip-flop that has: (i) a first reset terminal that is coupled to the pulse train generator, and configured to receive the pulse train, (ii) a first clock terminal that is coupled to the delay circuit, and configured to receive the first delayed clock, and (iii) a first output terminal that is configured to generate a first flip-flop output; and
a second flip-flop that has: (i) a first input terminal that is coupled to the first output terminal, and configured to receive the first flip-flop output, (ii) a second reset terminal that is coupled to the pulse train generator, and configured to receive the pulse train, (iii) a second clock terminal that is configured to receive an inverted version of the first delayed clock, and (iv) a second output terminal that is configured to generate the first detection signal.

15. The SoC of claim 13, wherein the second reset synchronizer circuit comprises:
a third flip-flop that has: (i) a third reset terminal that is coupled to the pulse train generator, and configured to receive the pulse train, (ii) a third clock terminal that is configured to receive an inverted version of the first delayed clock, and (iii) a third output terminal that is configured to generate a second flip-flop output; and
a fourth flip-flop that has: (i) a second input terminal that is coupled to the third output terminal, and configured to receive the second flip-flop output, (ii) a fourth reset terminal that is coupled to the pulse train generator, and configured to receive the pulse train, (iii) a fourth clock terminal that is coupled to the delay circuit, and configured to receive the first delayed clock, and (iv) a fourth output terminal that is configured to generate the second detection signal.

16. The SoC of claim 13, wherein the first phase is a low phase of the input clock and the second phase is a high phase of the input clock.

17. A method for detecting clock failure, the method comprising:
generating, by a pulse train generator of a clock failure detection system, a pulse train including a plurality of pulses aligned with a set of rising edges and a set of falling edges of an input clock;
delaying, by a delay circuit of the clock failure detection system, the input clock by a first time-interval to generate a first delayed clock;
receiving, by a failure detection circuit of the clock failure detection system, the pulse train and the first delayed clock; and generating, by the failure detection circuit, a clock detection signal based on the pulse train and the first delayed clock, wherein the clock detection signal transitions from a first logic state to a second logic state based on a failure in the input clock.

18. The method of claim 17, further comprising:
delaying, by the pulse train generator, the input clock by a second time-interval to generate a second delayed clock; and
generating, by the pulse train generator, first and second intermediate signals based on the second delayed clock and the input clock, wherein the first intermediate signal includes a first set of pulses aligned with the set of rising edges of the input clock and the second intermediate signal includes a second set of pulses aligned with the set of falling edges of the input clock, and wherein the pulse train is generated based on the first and second intermediate signals.

19. The method of claim 18, wherein each of the plurality of pulses of the pulse train have a first pulse width corresponding to the second time-interval, and wherein the first time-interval is greater than a clock period of the input clock and the second time-interval is less than half of the clock period.

20. The method of claim 17, further comprising:
generating, by the failure detection circuit, first and second detection signals based on the pulse train and the first delayed clock, wherein the first detection signal transitions from the first logic state to the second logic state based on the failure during a first phase of the input clock and the second detection signal transitions from the first logic state to the second logic state based on the failure during a second phase of the input clock; and
receiving, by the failure detection circuit, an enable input, wherein the clock detection signal is further generated based on the first and second detection signals and the enable input.

* * * * *